(12) United States Patent
Kang et al.

(10) Patent No.: US 11,251,182 B2
(45) Date of Patent: Feb. 15, 2022

(54) STAGGERED STACKED VERTICAL CRYSTALLINE SEMICONDUCTING CHANNELS

(71) Applicant: International Business Machines Corporation, Armonk, NY (US)

(72) Inventors: Tsung-Sheng Kang, Ballston Lake, NY (US); Tao Li, Albany, NY (US); Ardasheir Rahman, Schenectady, NY (US); Praveen Joseph, White Plains, NY (US); Indira Seshadri, Niskayuna, NY (US); Ekmini Anuja De Silva, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 10 days.

(21) Appl. No.: 16/821,604

(22) Filed: Mar. 17, 2020

(65) Prior Publication Data

US 2021/0296314 A1    Sep. 23, 2021

(51) Int. Cl.
*H01L 27/092*    (2006.01)
*H01L 29/78*    (2006.01)
(Continued)

(52) U.S. Cl.
CPC .... *H01L 27/0922* (2013.01); *H01L 21/02238* (2013.01); *H01L 21/02255* (2013.01);
(Continued)

(58) Field of Classification Search
CPC . H01L 27/092; H01L 27/0922; H01L 27/088; H01L 21/8221; H01L 21/823885;
(Continued)

(56) References Cited

U.S. PATENT DOCUMENTS

| 5,612,563 A | 3/1997 | Fitch et al. |
| 9,620,509 B1 | 4/2017 | Pao et al. |

(Continued)

FOREIGN PATENT DOCUMENTS

| CN | 106449596 A | 2/2017 |
| CN | 106847814 A | 6/2017 |
| WO | PCT/IB2021/051331 | 6/2021 |

OTHER PUBLICATIONS

Taejin Choi et al., "Hydrogen plasma-enhanced atomic layer deposition of hydrogenated amorphous carbon thin films", Surface and Coatings Technology, Jun. 2018, pp. 12-20, vol. 344.
(Continued)

*Primary Examiner* — Michael M Trinh
(74) *Attorney, Agent, or Firm* — Randall Bluestone; Ryan, Mason & Lewis, LLP

(57) ABSTRACT

A semiconductor structure includes a first semiconducting channel having a plurality of vertical nanowires and a second semiconducting channel having a plurality of vertical nanowires. The first semiconducting channel and the second semiconducting channel are configured to be in a stacked configuration. The plurality of vertical nanowires of the first semiconducting channel are configured to be in alternating positions relative to the plurality of vertical nanowires of the second semiconducting channel.

25 Claims, 12 Drawing Sheets

(51) Int. Cl.
*H01L 21/8238* (2006.01)
*H01L 27/12* (2006.01)
*H01L 29/06* (2006.01)
*H01L 21/02* (2006.01)
*H01L 29/66* (2006.01)

(52) U.S. Cl.
CPC ............ *H01L 21/823807* (2013.01); *H01L 21/823885* (2013.01); *H01L 27/1207* (2013.01); *H01L 29/0676* (2013.01); *H01L 29/66666* (2013.01); *H01L 29/7827* (2013.01)

(58) Field of Classification Search
CPC ......... H01L 21/823487; H01L 21/8238; H01L 21/823871; H01L 21/02238; H01L 21/02255
See application file for complete search history.

(56) References Cited

U.S. PATENT DOCUMENTS

| | | |
|---|---|---|
| 9,659,963 B2 | 5/2017 | Cheng et al. |
| 9,680,473 B1 | 6/2017 | Anderson et al. |
| 9,721,784 B2 | 8/2017 | Behera et al. |
| 9,824,933 B1 | 11/2017 | Pawlak |
| 9,997,413 B1 | 6/2018 | Leobandung |
| 10,157,794 B1 | 12/2018 | Suvarna et al. |
| 10,217,674 B1 | 2/2019 | Hook et al. |
| 10,297,513 B1 | 5/2019 | Yamashita et al. |
| 10,629,538 B2 * | 4/2020 | Zhang .............. H01L 21/76897 |
| 10,784,170 B2 | 9/2020 | Radosavljevic et al. |
| 10,971,490 B2 * | 4/2021 | Zhou .................... H01L 29/1037 |
| 2005/0253143 A1 * | 11/2005 | Takaura ................ H01L 27/11 257/67 |
| 2013/0001701 A1 | 1/2013 | Christensen et al. |
| 2017/0025412 A1 | 1/2017 | Jun et al. |
| 2018/0122793 A1 * | 5/2018 | Moroz ................. H01L 29/4238 |
| 2018/0366372 A1 | 12/2018 | Suvarna et al. |
| 2019/0206861 A1 * | 7/2019 | Beigel ...................... G11C 29/42 |
| 2019/0355717 A1 | 11/2019 | Zhou et al. |
| 2020/0066732 A1 * | 2/2020 | Rubin ................. H01L 21/8221 |
| 2020/0203329 A1 * | 6/2020 | Kanamori ............. H01L 24/05 |

OTHER PUBLICATIONS

B. E. E. Kastenmeier et al., "Highly selective etching of silicon nitride over silicon and silicon dioxide", Journal of Vacuum Science & Technology A, 1999, vol. 17, Issue 6, pp. 3179-3184.

Tatsuya Urakawa et al., "H2/N2 Plasma Etching Rate of Carbon Films Deposited by H-Assisted Plasma Chemical Vapor Deposition", Japanese Journal of Applied Physics, 2013, vol. 52, No. 1S.

Hag Joo Lee et al., "Inductively Coupled Plasma Etching of Chemical-Vapor-Deposited Amorphous Carbon in N2/O2/Ar Chemistries", Japanese Journal of Applied Physics, 2009, vol. 48, pp. 08HD05-1-08HD05-4.

Yudai Miyawaki et al., "Highly Selective Etching of SiO2 over Si3N4 and Si in Capacitively Coupled Plasma Employing C5HF7 Gas", Japanese Journal of Applied Physics, 2013, pp. 016201-1-16201-9 vol. 52.

Eugene A. Irene et al., "Silicon Oxidation Studies: Silicon Orientation Effects on Thermal Oxidation", Journal Electrochem. Society: Solid-State Science and Technology, Jun. 1986, pp. 1253-1256.

* cited by examiner

STAGGERED STACKED VERTICAL CRYSTALLINE SEMICONDUCTING CHANNELS

BACKGROUND

Stacking field-effect transistors (FETs) in the vertical direction gives an additional dimension for complementary metal-oxide-semiconductor (CMOS) area scaling. In a typical CMOS layout, ninety percent of the time a first transistor is connected to at least a second transistor. For example, a drain of an n-type transistor is connected to the drain of a p-type transistor to form an inverter. Other arrangements, such as connections between the drain of a first transistor connected to the source of a second transistor, a drain of a first transistor connected to the drain of a second transistor, or a source of a first transistor connected to the source of a second transistor are also considered, where the first and second transistors may be any combination of n-type or p-type transistors.

Vertical field effect transistors (VFETs) have a unique structure that can help the stacking process. As opposed to planar CMOS devices, VFETs are oriented with a vertical fin channel disposed on a bottom source/drain and a top source/drain disposed on the fin channel. The gate runs vertically alongside the vertical fin channel. VFETs have been pursued as a potential device option for scaling CMOS to the 5 nanometer (nm) node and beyond.

SUMMARY

Embodiments of the invention include structures and methods for forming staggered stacked vertical semiconducting channels. For example, one exemplary embodiment includes a semiconductor structure comprising a first semiconducting channel comprising a plurality of vertical nanowires; and a second semiconducting channel comprising a plurality of vertical nanowires. The first semiconducting channel and the second semiconducting channel are configured to be in a stacked configuration. The plurality of vertical nanowires of the first semiconducting channel are configured to be in alternating positions relative to the plurality of vertical nanowires of the second semiconducting channel.

Another exemplary embodiment includes a logic device, comprising one or more semiconductor structures. At least one of the one or more semiconductor structures comprises a first semiconducting channel comprising a plurality of vertical nanowires; and a second semiconducting channel comprising a plurality of vertical nanowires. The first semiconducting channel and the second semiconducting channel are configured to be in a stacked configuration. The plurality of vertical nanowires of the first semiconducting channel are configured to be in alternating positions relative to the plurality of vertical nanowires of the second semiconducting channel.

Another exemplary embodiment includes an integrated circuit logic device, comprising one or more semiconductor structures. At least one of the one or more semiconductor structures comprises a first semiconducting channel comprising a plurality of vertical nanowires; and a second semiconducting channel comprising a plurality of vertical nanowires. The first semiconducting channel and the second semiconducting channel are configured to be in a stacked configuration. The plurality of vertical nanowires of the first semiconducting channel are configured to be in alternating positions relative to the plurality of vertical nanowires of the second semiconducting channel.

Another exemplary embodiment includes a method comprising forming a first semiconducting channel comprising a plurality of vertical nanowires and a second semiconducting channel comprising a plurality of vertical nanowires on a semiconductor substrate. The first semiconducting channel and the second semiconducting channel are configured to be in a stacked configuration. The plurality of vertical nanowires of the first semiconducting channel are configured to be in alternating positions relative to the plurality of vertical nanowires of the second semiconducting channel.

Another exemplary embodiment includes a method comprising forming a plurality of layered silicon-insulator-silicon nanowires from a surface of a substrate. The plurality of nanowires comprises a hardmask on a top surface thereof. The method further comprises forming a liner on exterior surfaces of alternating layered silicon-insulator-silicon nanowires. The liner is formed on a portion of the insulator layer extending to the hardmask and exposing the bottom silicon layer of the layered silicon-insulator-silicon nanowires. The method further comprises forming a first oxide layer on exterior surfaces of the other alternating layered silicon-insulator-silicon nanowires. The first oxide layer is formed on a portion of the insulator layer extending to a top surface of the substrate and exposing the top silicon layer of the layered silicon-insulator-silicon nanowires. The method further comprises thermally oxidizing the exposed bottom silicon layer of the layered silicon-insulator-silicon nanowires and the exposed top silicon layer of the layered silicon-insulator-silicon nanowires silicon layers.

These and other features, objects and advantages of the present invention will become apparent from the following detailed description of illustrative embodiments thereof, which is to be read in connection with the accompanying drawings.

DETAILED DESCRIPTION

This disclosure relates generally to semiconductor fabrication techniques and, in particular, to structures and methods for fabricating staggered stacked vertical semiconducting channels for use in making vertical field-effect transistor devices. Vertical stacking of VFETs makes connecting the source/drain (S/D) contacts of the bottom FET difficult since fabrication of "L" shaped conducting materials will be required. The vertically stacked crystalline semiconductor structure (or vertical fin array) of illustrative embodiments, in which the semiconductor fins are staggered in pitch, allows for connecting the S/D contacts of the eventual bottom FET in an easy and straightforward manner It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount.

Figure 1:
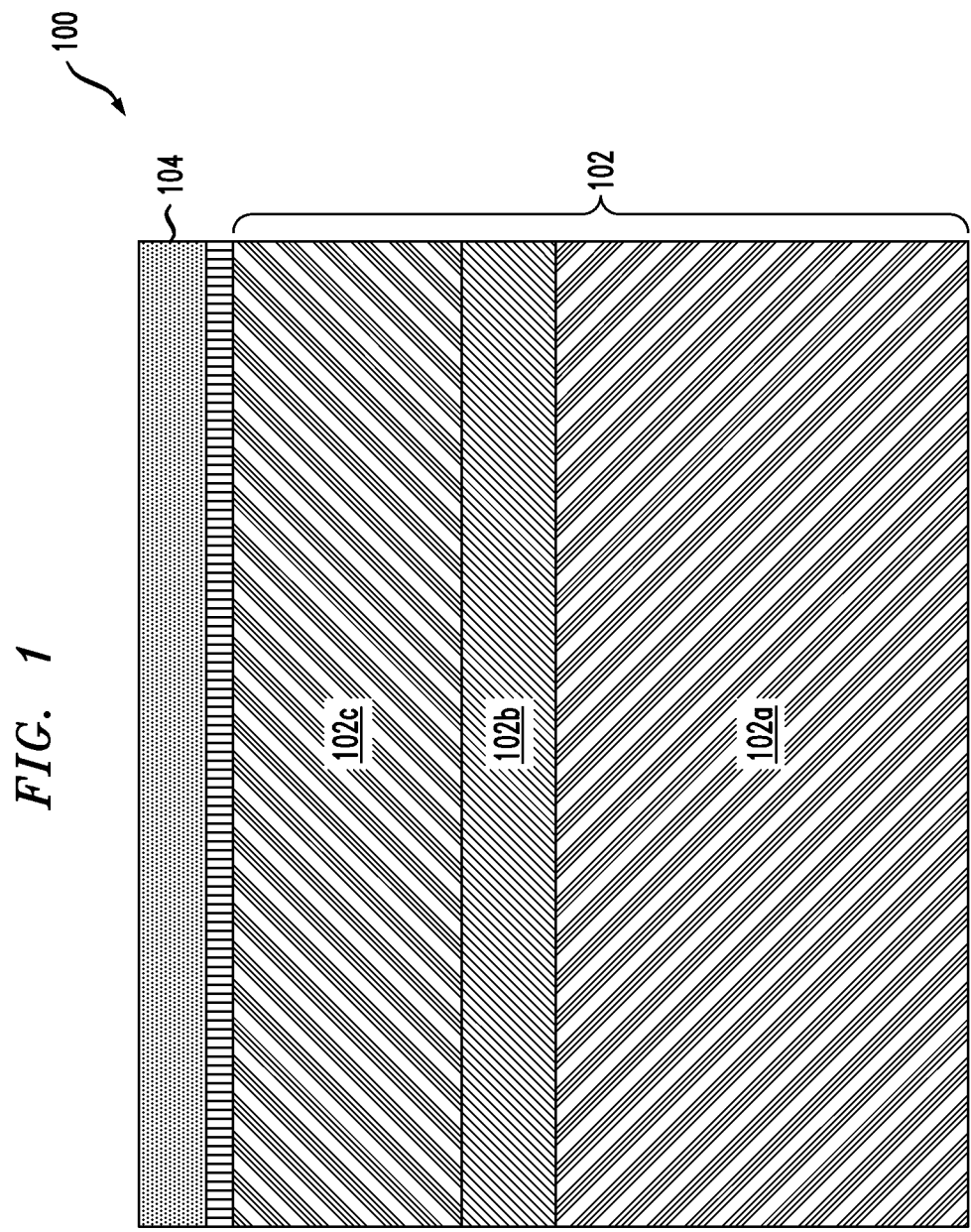
FIG. 1 is a schematic cross-sectional side view of a semiconductor structure at a first-intermediate stage of fabrication, according to one or more illustrative embodiments.

An illustrative embodiment for forming a semiconductor structure will be discussed below with reference to FIGS. 1-12. Referring now to the figures, FIG. 1 is a cross-sectional view of semiconductor structure 100 including semiconductor substrate 102 and a hardmask layer 104. The semiconductor substrate 102 may comprise a silicon on insulator (SOI) substrate wafer of a conventional type such as, for example, an extremely thin silicon on insulator (ETSOI) or ultra-thin body and buried oxide (UTBB) silicon on insulator (SOI) known to those skilled in the art. Alternatively, the semiconductor substrate 102 may comprise a bulk semiconductor substrate wafer. As is shown, substrate 102 can first include a base layer 102a, e.g., silicon. An insulator layer 102b, e.g., a buried oxide layer, can be formed on base layer 102a. A silicon layer 102c is in turn formed over insulator layer 102b, although silicon layer 102c could also be any other suitable semiconducting layer. In one embodiment, substrate 102 is a layered silicon-insulator-silicon substrate.

The top semiconductor layer of the SOI substrate or the semiconductor material of the bulk substrate may be doped as appropriate for the integrated circuit application. In one illustrative embodiment of an SOI substrate, the top semiconductor layer may be of the fully depleted (FD) configuration. The bulk substrate may include, for example, a number of epitaxially grown semiconductor layers. The process techniques described herein are equally applicable to SOI and bulk substrates, as well as other types of substrate.

Hardmask layer 104 is deposited on substrate 102 using any conventional deposition process such as, for example, atomic layer deposition (ALD), chemical vapor deposition (CVD), plasma enhanced chemical vapor deposition (PECVD), physical vapor deposition (PVD), or other like processes. Suitable material for hardmask layer 104 includes, for example, TiN, $SiO_2$, TaN, SiN, AlOx, SiC and the like. Hardmask layer 104 can then be planarized by, for example, a planarization process such as a chemical mechanical planarization (CMP) process.

Figure 2:
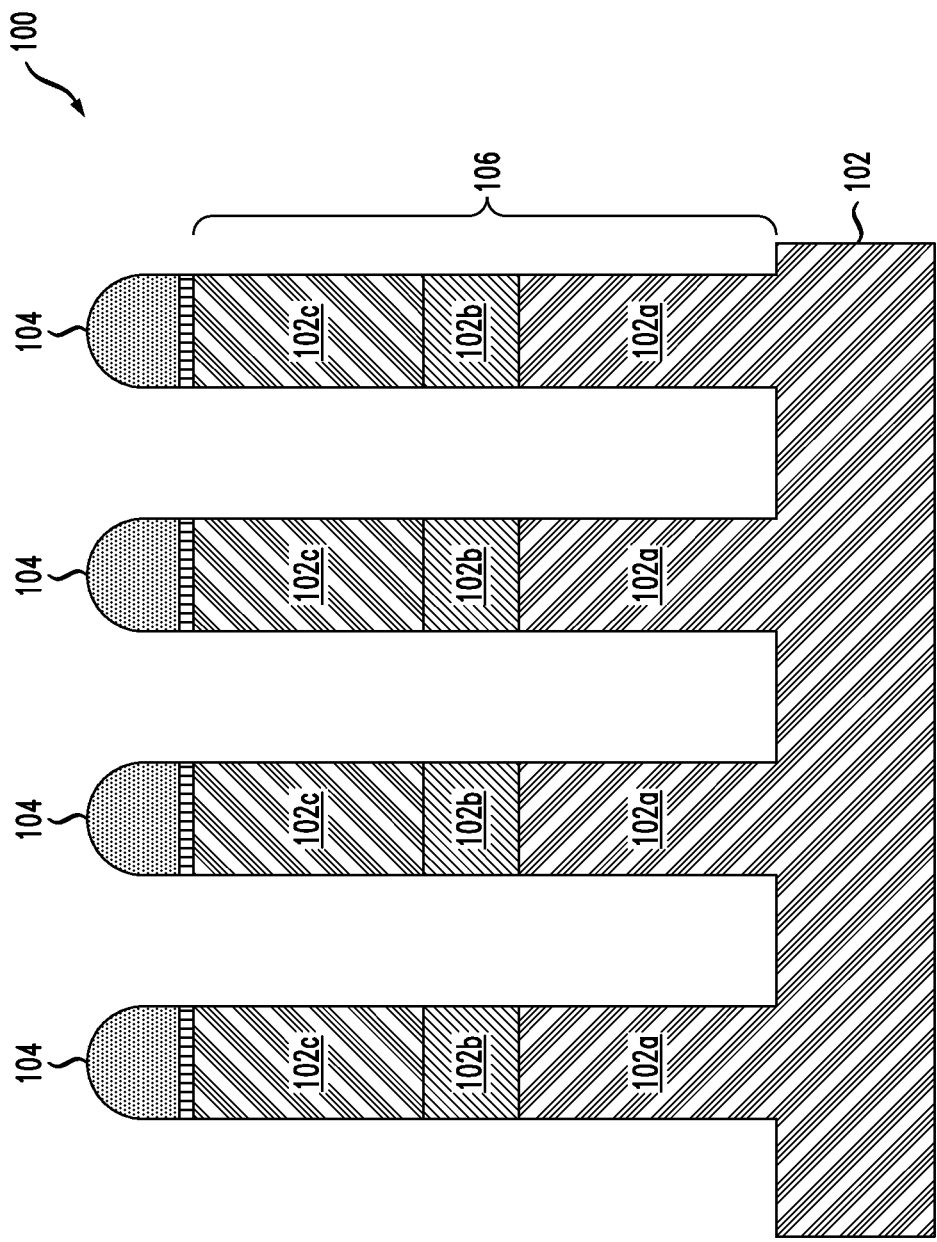
FIG. 2 is a schematic cross-sectional side view of the semiconductor structure at a second-intermediate stage of fabrication, according to one or more illustrative embodiments.

A next step in forming vertically stacked fins for semiconductor structure 100 is illustrated in FIG. 2 in which semiconductor structure 100 is patterned to form a set of vertical nanowires 106. Vertical nanowires 106 have sidewalls that are substantially vertical. Although four vertical nanowires 106 are shown in FIG. 2, the number of vertical nanowires 106 should not be considered limiting. To form the vertical nanowires 106, lithography and etching are performed using any type of patterning technique such as a direct-print lithography or sidewall-image-transfer (SIT) process. A direct-print lithography process maybe one of 193i lithography or extreme ultra-violet (EUV) lithography, familiar to those skilled in the art. A SIT process may be referred to as a self-aligned double patterning (SADP) process. In some embodiments, a SIT process may be used to pattern narrow lines of hardmask 104. For example, lithography can include forming a photoresist (not shown) on hardmask layer 104, exposing the photoresist to a desired pattern of radiation, and then developing the exposed photoresist with a resist developer to provide a patterned photoresist on top of the hardmask layer 104.

At least one etch is employed to transfer the pattern from the patterned photoresist into hardmask layer 104 and the substrate 102. Vertical nanowires 106 are formed by etching deeply into but not through substrate 102. For example, etching is carried out by etching through hardmask layer 104, silicon layer 102c, insulator layer 102b and a portion of base layer 102a to form vertical nanowires 106. The etching process may be a dry etch (e.g., reactive ion etching, plasma etching, ion beam etching, or laser ablation). The etching process may be a wet chemical etch (e.g., with potassium hydroxide, or sulfuric acid and hydrogen peroxide). Both dry etching and wet chemical etching processes may be used. After transferring the pattern, the patterned photoresist is removed utilizing resist stripping processes, for example, ashing. Ashing is performed using a suitable reaction gas, for example, $O_2$, $N_2$, $H_2/N_2$, $O_3$, $CF_4$, or any combination thereof.

Figure 3:
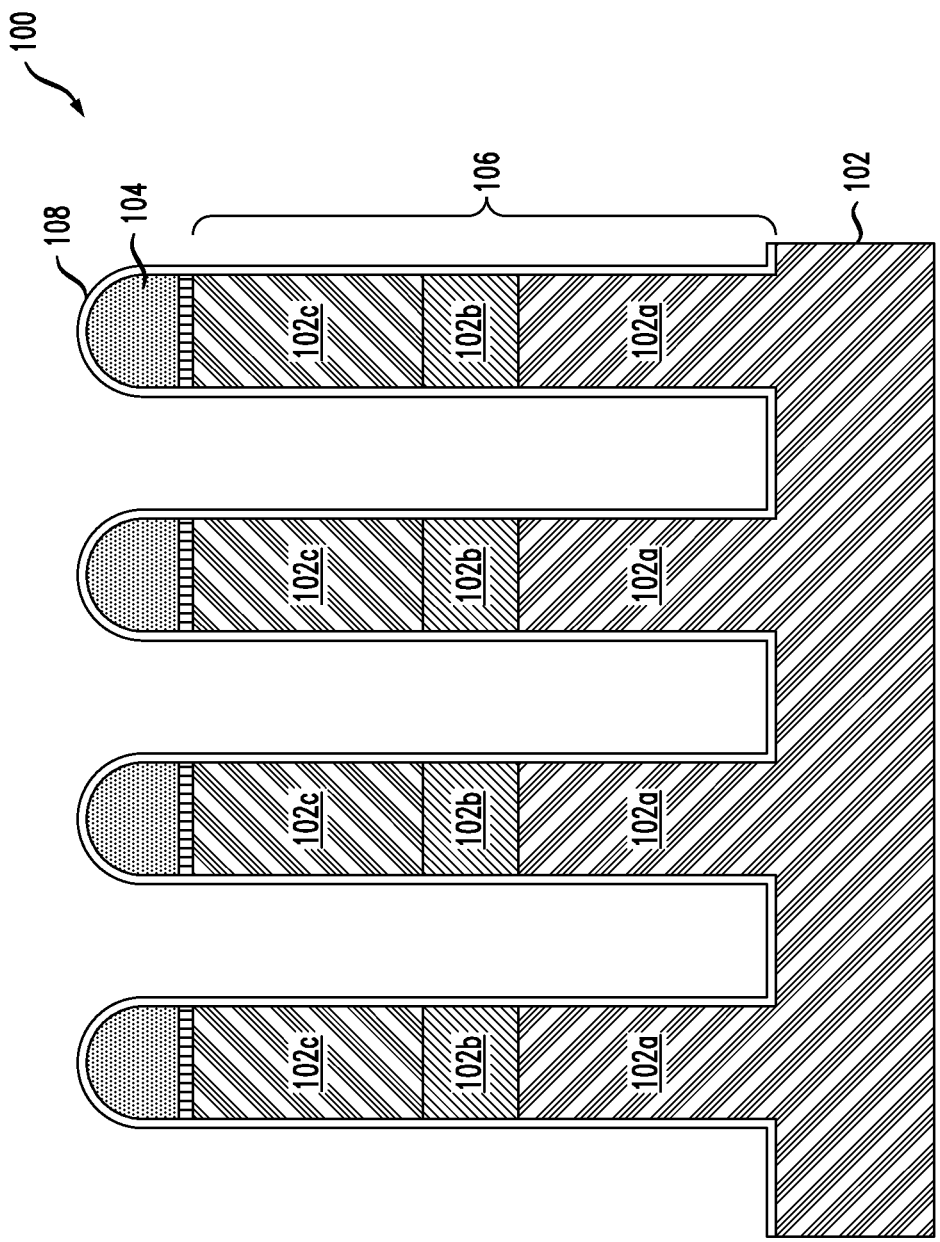
FIG. 3 is a schematic cross-sectional side view of the semiconductor structure at a third-intermediate stage of fabrication, according to one or more illustrative embodiments.

A next step in forming vertically stacked fins for semiconductor structure 100 is illustrated in FIG. 3 in which liner 108 is formed on substrate 102, hardmask 104 and vertical nanowires 106. The liner 108 can be any liner material such as a dielectric material. Suitable dielectric material includes, for example, silicon nitride, silicon oxide, silicon oxynitride, a dielectric metal oxide, a dielectric metal nitride, or a combination thereof. The liner 108 can be formed, for example, by depositing a liner layer using an ALD process. Liner 108 can have a thickness ranging from about 1 to about 3 nanometers (nm).

Figure 4:
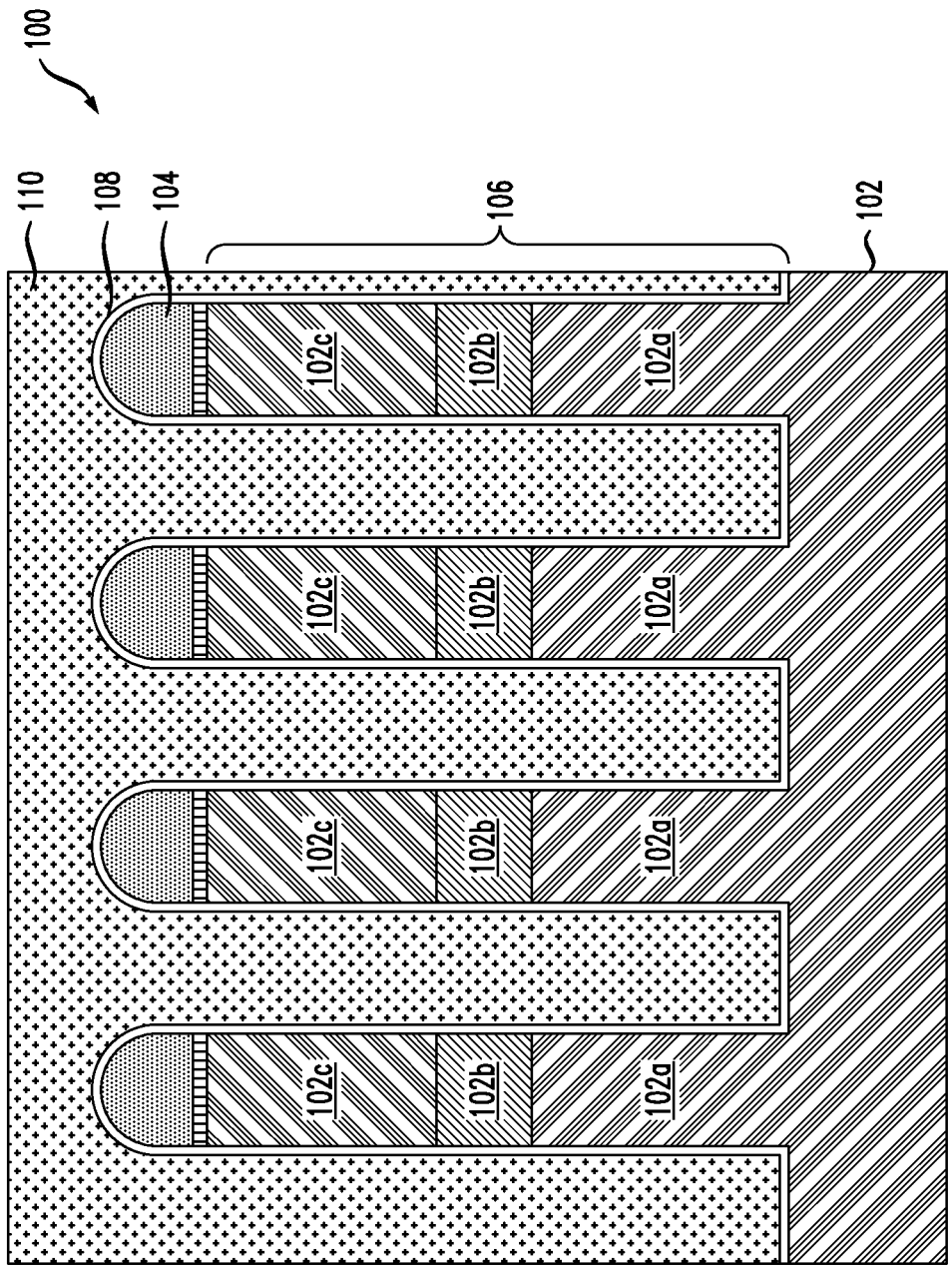
FIG. 4 is a schematic cross-sectional side view of the semiconductor structure at a fourth-intermediate stage of fabrication, according to one or more illustrative embodiments.

A next step in forming vertically stacked fins for semiconductor structure 100 is illustrated in FIG. 4 in which the etched areas are then filled with oxide 110 on liner 108 and over vertical nanowires 106. A suitable oxide material includes, for example, silicon dioxide. In one embodiment, oxide fill 110 is formed by depositing a blanket layer of oxide over vertical nanowires 106 and then planarizing the oxide by, for example, a CMP process.

Figure 5:
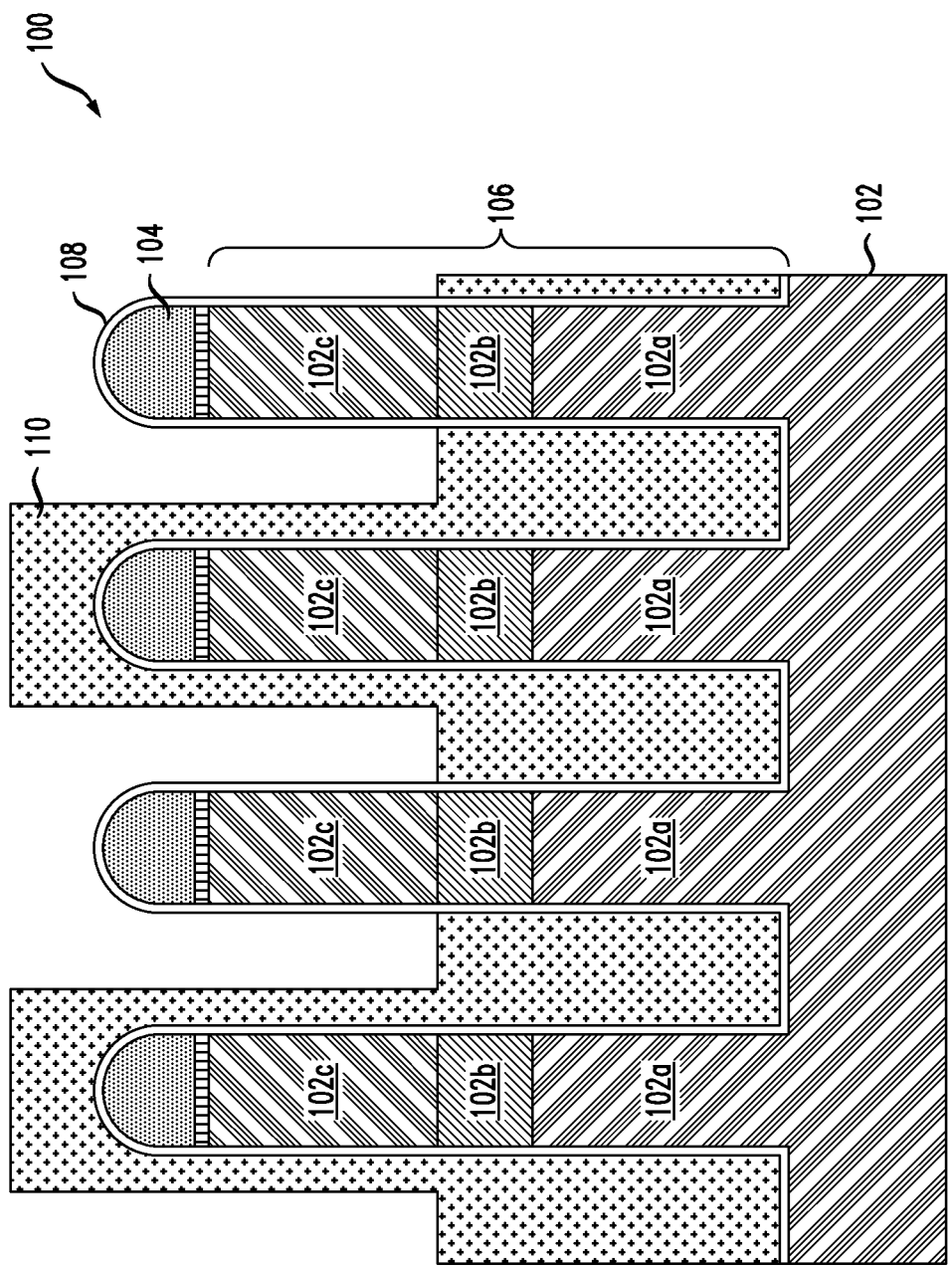
FIG. 5 is a schematic cross-sectional side view of the semiconductor structure at a fifth-intermediate stage of fabrication, according to one or more illustrative embodiments.

A next step in forming vertically stacked fins for semiconductor structure 100 is illustrated in FIG. 5 in which a portion of oxide fill 110 is patterned using lithography to expose a top portion of alternating vertical nanowires 106 and liner 108. In one embodiment, oxide fill 110 can be selectively removed using an anisotropic etch. For example, in one illustrative embodiment, anisotropic etching can be performed by means of hydrofluoric acid, such as in the form of gaseous anhydrous HF together with ammonia. In another illustrative embodiment, anisotropic etching can be performed by hydrofluorocarbon plasma etch. For example, a plasma etch can be carried out using a hydrofluorocarbon plasma gas combined with an inert gas. In general, the inert gas can be at least 90%. In one illustrative embodiment, the hydrofluorocarbon can be $C_5HF_7$ and the inert gas can be argon and oxygen, and when excited in a plasma etch chamber, creates a high-density plasma. In an illustrative embodiment, a radio frequency (RF) power source inductively couples power into the chamber with the substrate being etched supported on a pedestal. The pedestal is also biased by an RF power source at a higher power than the inductively coupled power. Also, a silicon containing surface may be included in the chamber and maintained at least at 20° C. to scavenge fluorine from the plasma. As a result, the etch exhibits a high selectivity to the oxide fill 110 (e.g., silicon oxide) over the liner 108 (e.g., silicon nitride) and the lithographically patterned photoresist (not shown). Because of the high selectivity of the plasma etch, the liner 108 remains unetched. Thus, during this etch, the oxide fill 110 is selectively removed to expose a top portion of alternating vertical nanowires 106. In one embodiment, oxide fill 110 is removed down to a top surface of insulator layer 102b of each alternating vertical nanowires 106.

Figure 6:
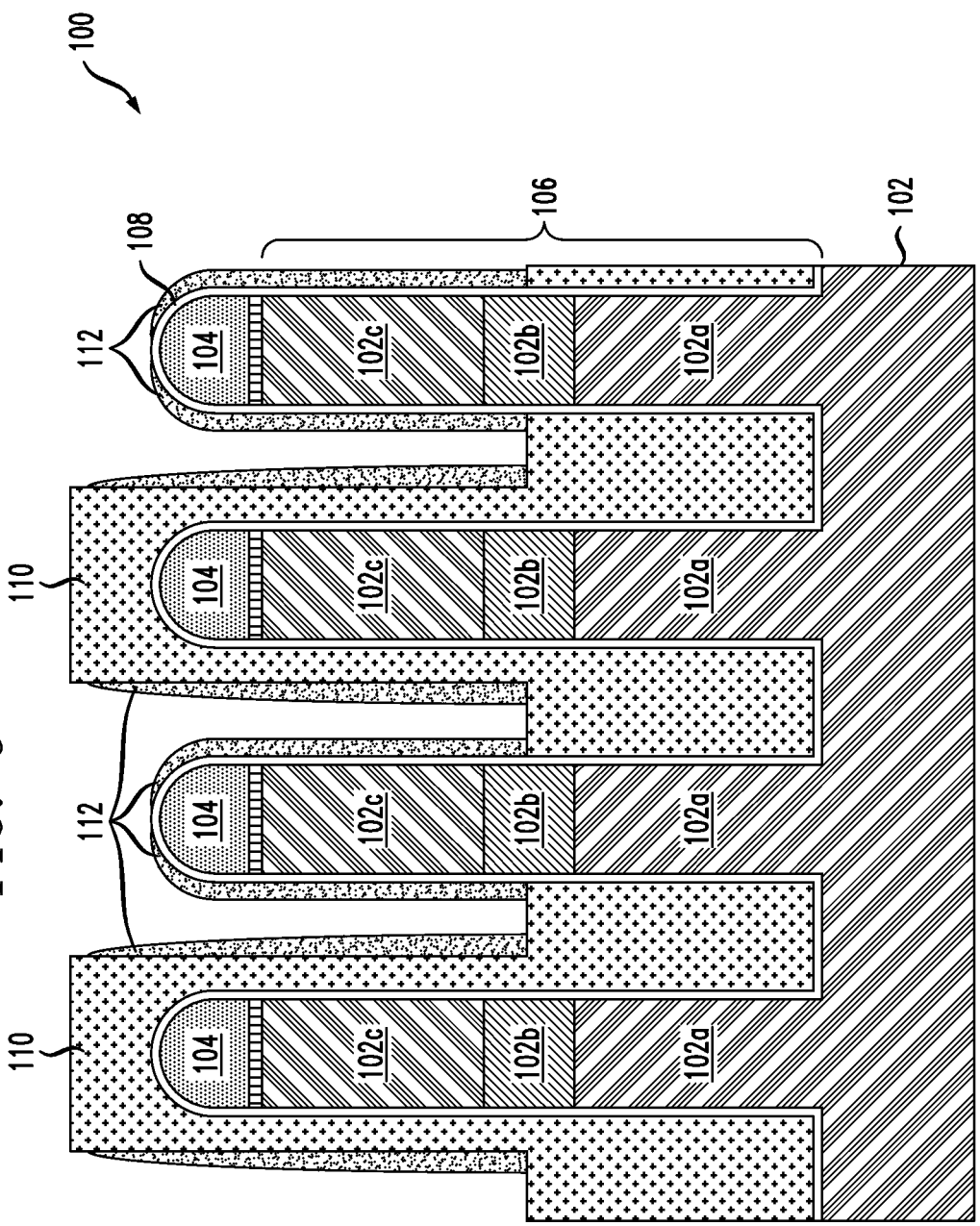
FIG. 6 is a schematic cross-sectional side view of the semiconductor structure at a sixth-intermediate stage of fabrication, according to one or more illustrative embodiments.

A next step in forming vertically stacked fins for semiconductor structure 100 is illustrated in FIG. 6 in which spacer 112 is deposited on sidewalls of the oxide fill 110 and liner 108 on the alternating vertical nanowires 106. Spacer 112 can be deposited by any conventional techniques such as ALD and etched back using an anisotropic dry-etch process such as reactive ion etching (RIE). Suitable material for spacer 112 includes, for example, amorphous carbon (a-C). If necessary, any spacer material on the horizontal portion of structure 100 can be removed by, for example, RIE. Spacer 112 can have a thickness ranging from about 1 nm to about 3 nm.

Figure 7:
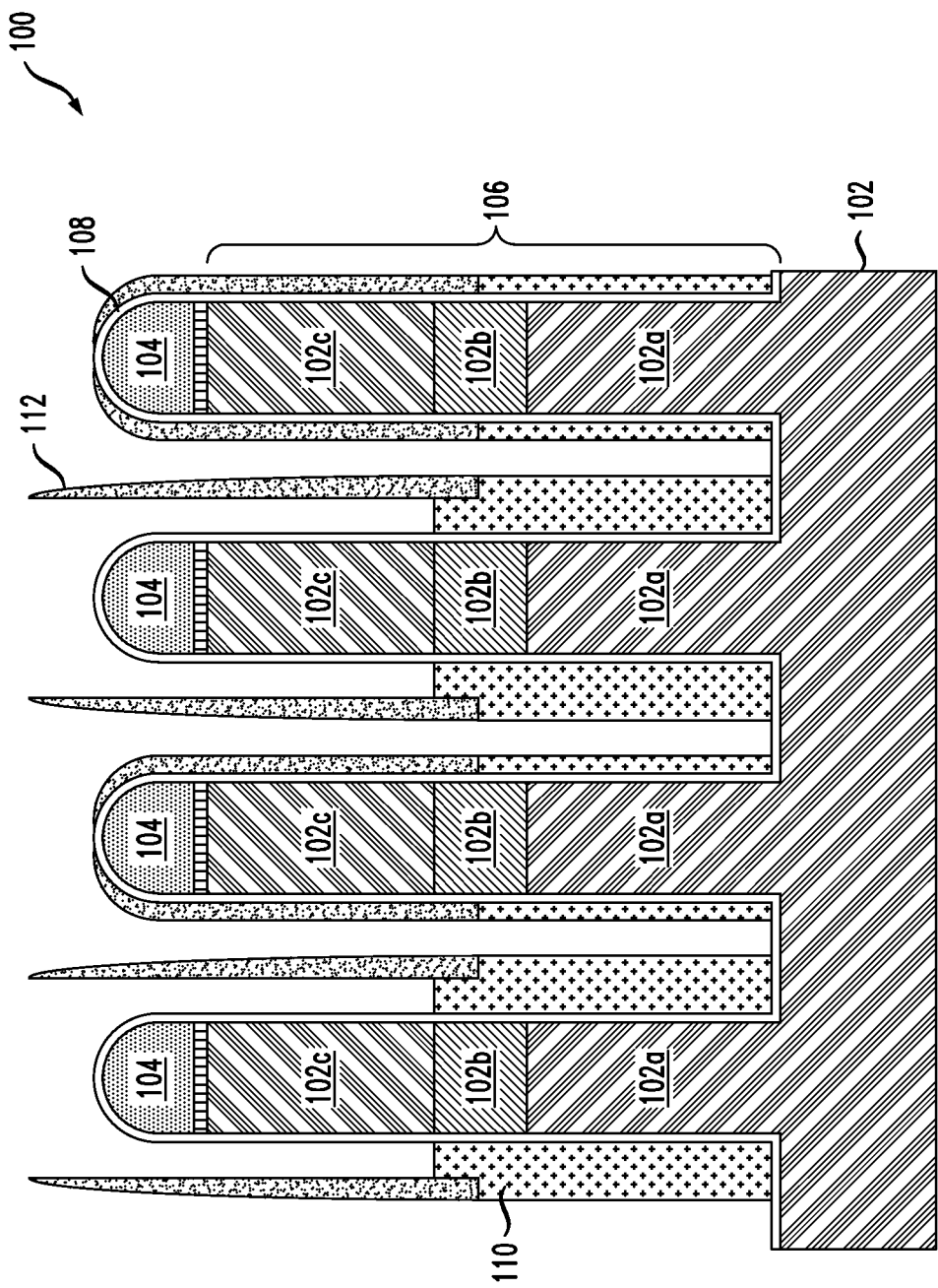
FIG. 7 is a schematic cross-sectional side view of the semiconductor structure at a seventh-intermediate stage of fabrication, according to one or more illustrative embodiments.

A next step in forming vertically stacked fins for semiconductor structure 100 is illustrated in FIG. 7 in which oxide fill 110 is further removed between adjacent spacers 112 to expose a top surface of liner 108. In one embodiment, oxide fill 110 can be selectively removed using an anisotropic etch. In one illustrative embodiment, the anisotropic etch can be performed by a hydrofluorocarbon plasma etch. For example, a plasma etch can be carried out using a hydrofluorocarbon plasma gas combined with an inert gas. In one illustrative embodiment, the inert gas can be at least about 90% of the plasma etch. In one illustrative embodiment, the hydrofluorocarbon can be $C_5HF_7$ and the inert gas can be argon and oxygen, and when excited in a plasma etch chamber, creates a high-density plasma as described above. As a result, the etch exhibits a high selectivity to the oxide fill 110 over the liner 108 and spacers 112. Because of the high selectivity of the plasma etch, the liner 108 and spacers 112 remain unetched. In another illustrative embodiment, the anisotropic etch can be performed by means of hydrofluoric acid, such as in the form of gaseous anhydrous HF together with ammonia.

Thus, during this etch, the oxide fill 110 is selectively removed to expose a top portion of alternating vertical nanowires 106 and a top surface of liner 108 between adjacent spacers 112. In addition, oxide fill 110 remains under the spacers 112. In one embodiment, oxide fill 110 is removed down to a top surface of insulator layer 102b of each alternating vertical nanowire 106.

Figure 8:
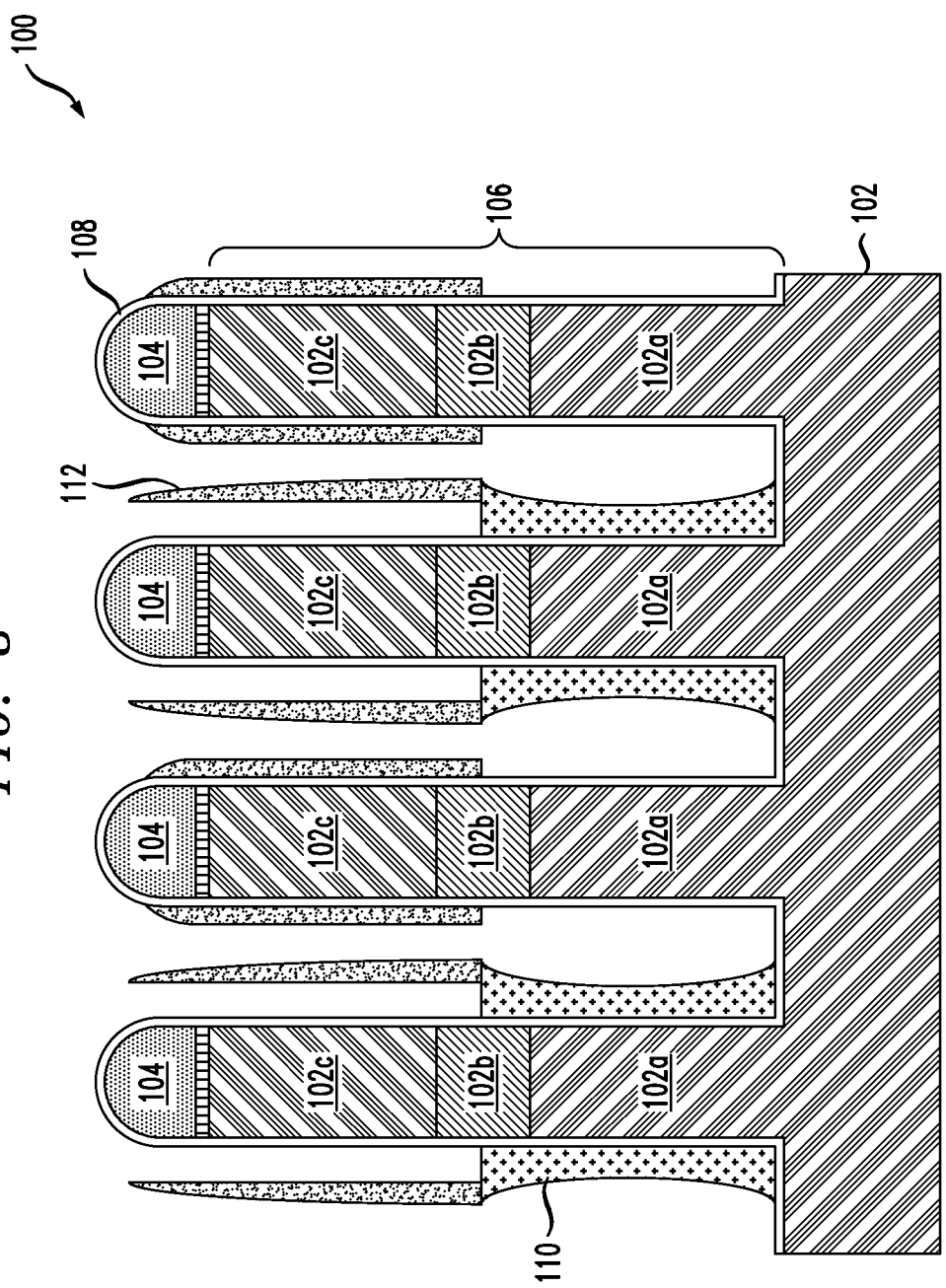
FIG. 8 is a schematic cross-sectional side view of the semiconductor structure at an eighth-intermediate stage of fabrication, according to one or more illustrative embodiments.

A next step in forming vertically stacked fins for semiconductor structure 100 is illustrated in FIG. 8 in which oxide fill 110 is selectively removed under each spacer 112 formed on sidewalls of liner 108 of each alternating vertical nanowires 106 by isotropic etching. In one embodiment, oxide fill 110 can be selectively removed using an isotropic etch. In one illustrative embodiment, the isotropic etch can be performed by a hydrofluorocarbon plasma etch. For example, a plasma etch can be carried out using a hydrofluorocarbon plasma gas combined with an inert gas. In general, the inert gas can be at least 90%. In one illustrative embodiment, the hydrofluorocarbon can be $C_5HF_7$ and the inert gas can be argon and oxygen, and when excited in a plasma etch chamber, creates a high-density plasma as described above. As a result, the etch exhibits a high selectivity to the oxide fill 110 over the liner 108 and spacers 112. Because of the high selectivity of the plasma etch, the liner 108 and spacers 112 remain unetched. In another illustrative embodiment, the isotropic etch can be performed by means of hydrofluoric acid, such as in the form of gaseous anhydrous HF together with ammonia. As discussed above, oxide fill 110 is selectively removed through the flow of wet etchant between the spacers 112 by isotropic etching. During this etch, a portion of oxide fill 110 on sidewall of adjacent vertical nanowires 106 can be removed. In addition, a portion of oxide fill 110 can be recessed isotropically under spacers 112 of adjacent vertical nanowires 106.

Figure 9:
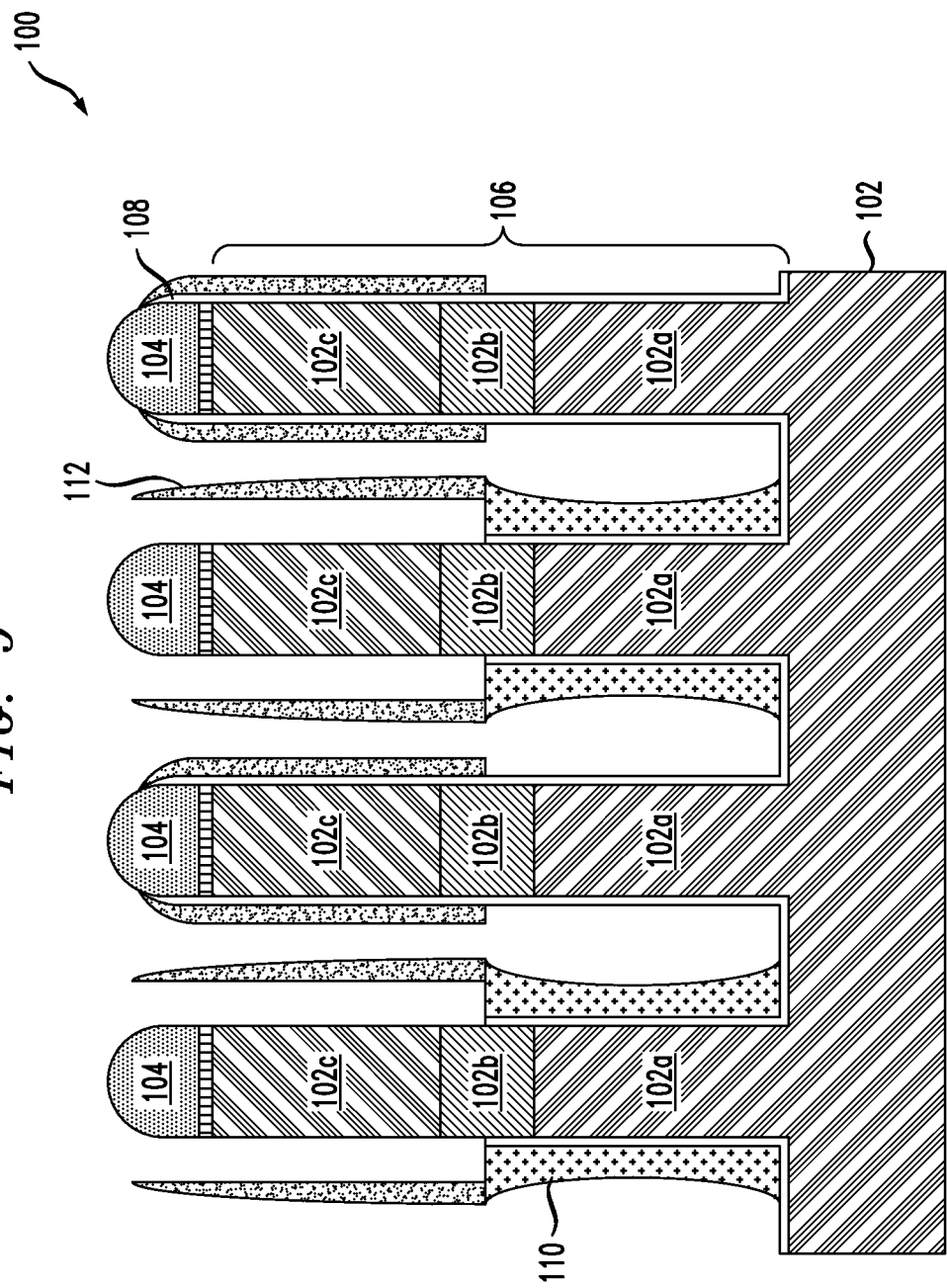
FIG. 9 is a schematic cross-sectional side view of the semiconductor structure at a ninth-intermediate stage of fabrication, according to one or more illustrative embodiments.

A next step in forming vertically stacked fins for semiconductor structure 100 is illustrated in FIG. 9 in which a portion of exposed liner 108 above oxide fill 110 on alternating vertical nanowires 106 and the exposed liner 108 on hardmark 104 of each vertical nanowire 106 is selectively removed. In one illustrative embodiment, the exposed liner 108 is selectively removed by isotropic etching. In one illustrative embodiment, the isotropic etch can be performed by a fluorocarbon plasma etch. For example, a plasma etch can be carried out using a fluorocarbon plasma gas combined with an inert gas. In general, the inert gas can be at least 90%. In one illustrative embodiment, the fluorocarbon can be $CF_4$ and the inert gas can be oxygen and nitrogen, and when excited in a plasma etch chamber, creates a high-density plasma as described above. In another illustrative embodiment, the fluorocarbon can be $CF_4$ and the inert gas can be argon, and when excited in a plasma etch chamber, creates a high-density plasma as described above. As a result, the etch exhibits a high selectivity to the exposed liner 108 over the oxide fill 110 and spacers 112.

Figure 10:
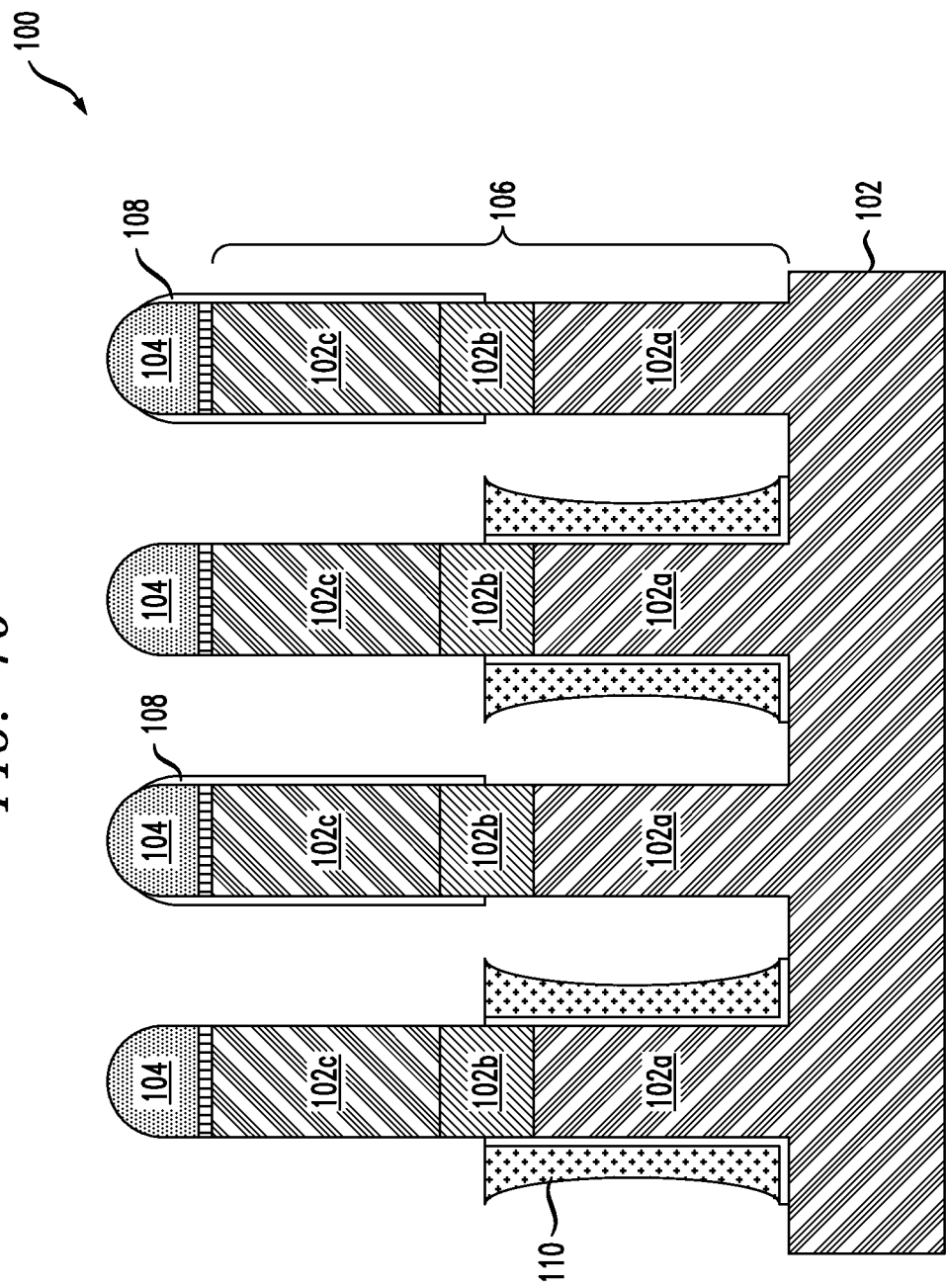
FIG. 10 is a schematic cross-sectional side view of the semiconductor structure at a tenth-intermediate stage of fabrication, according to one or more illustrative embodiments.

A next step in forming vertically stacked fins for semiconductor structure 100 is illustrated in FIG. 10 in which spacers 112 are removed. Spacers 112 can be removed by any suitable etching process, including but not limited to, a wet etch process or a dry etch. For example, the etching can be carried out using a RIE or plasma etch process, and a $N_2/H_2$ chemistry or a $N_2/H_2$ chemistry in an inert gas such as argon.

Figure 11:
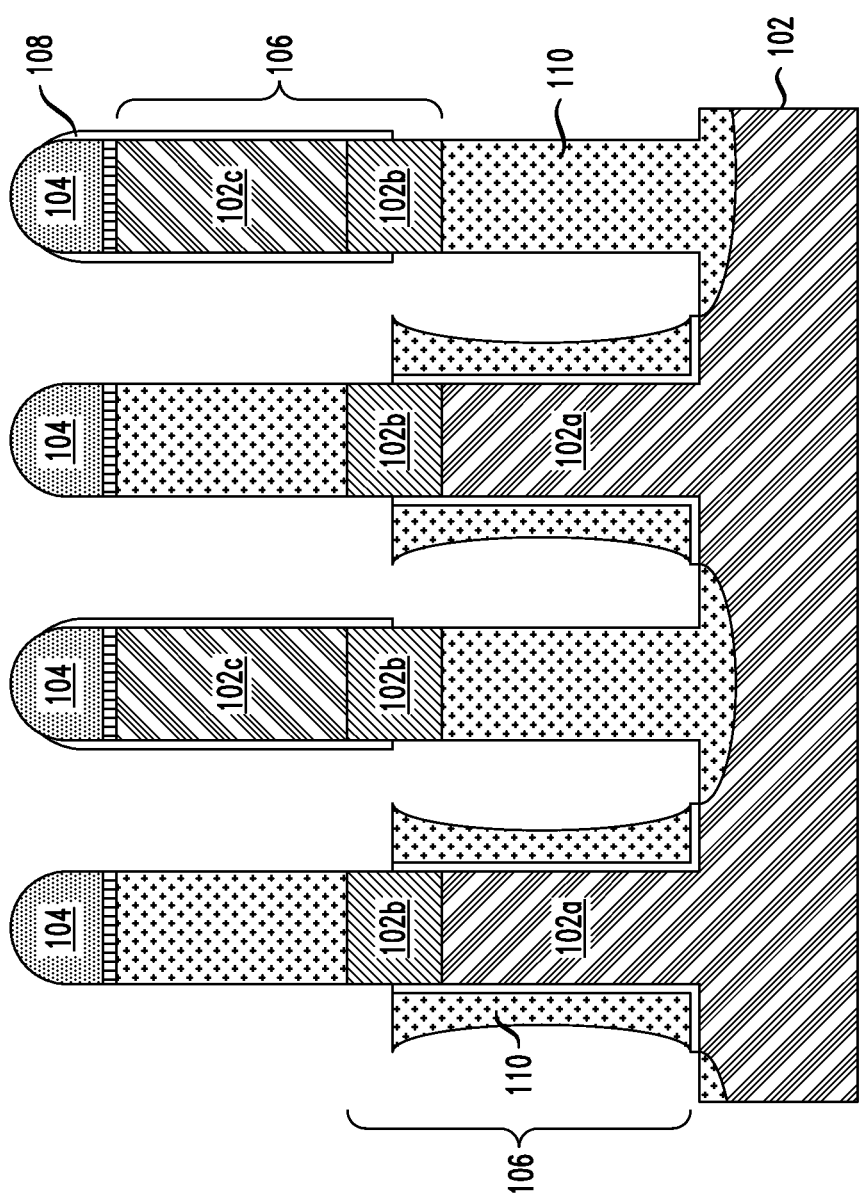
FIG. 11 is a schematic cross-sectional side view of the semiconductor structure at an eleventh-intermediate stage of fabrication, according to one or more illustrative embodiments.

A next step in forming vertically stacked fins for semiconductor device 100 is illustrated in FIG. 11 in which the exposed silicon portions 102a and 102c are subjected to a thermal oxidation process as known in the art. The thermal oxidation process is performed to oxidize the exposed portions 102a of alternating vertical nanowires 106 and the exposed portion 102c of alternating vertical nanowires 106. This process forms an oxide within the exposed portions 102a of alternating vertical nanowires 106 and within the exposed portions 102c of alternating vertical nanowires 106. As shown, the oxide formed is the same as oxide fill 110.

Figure 12:
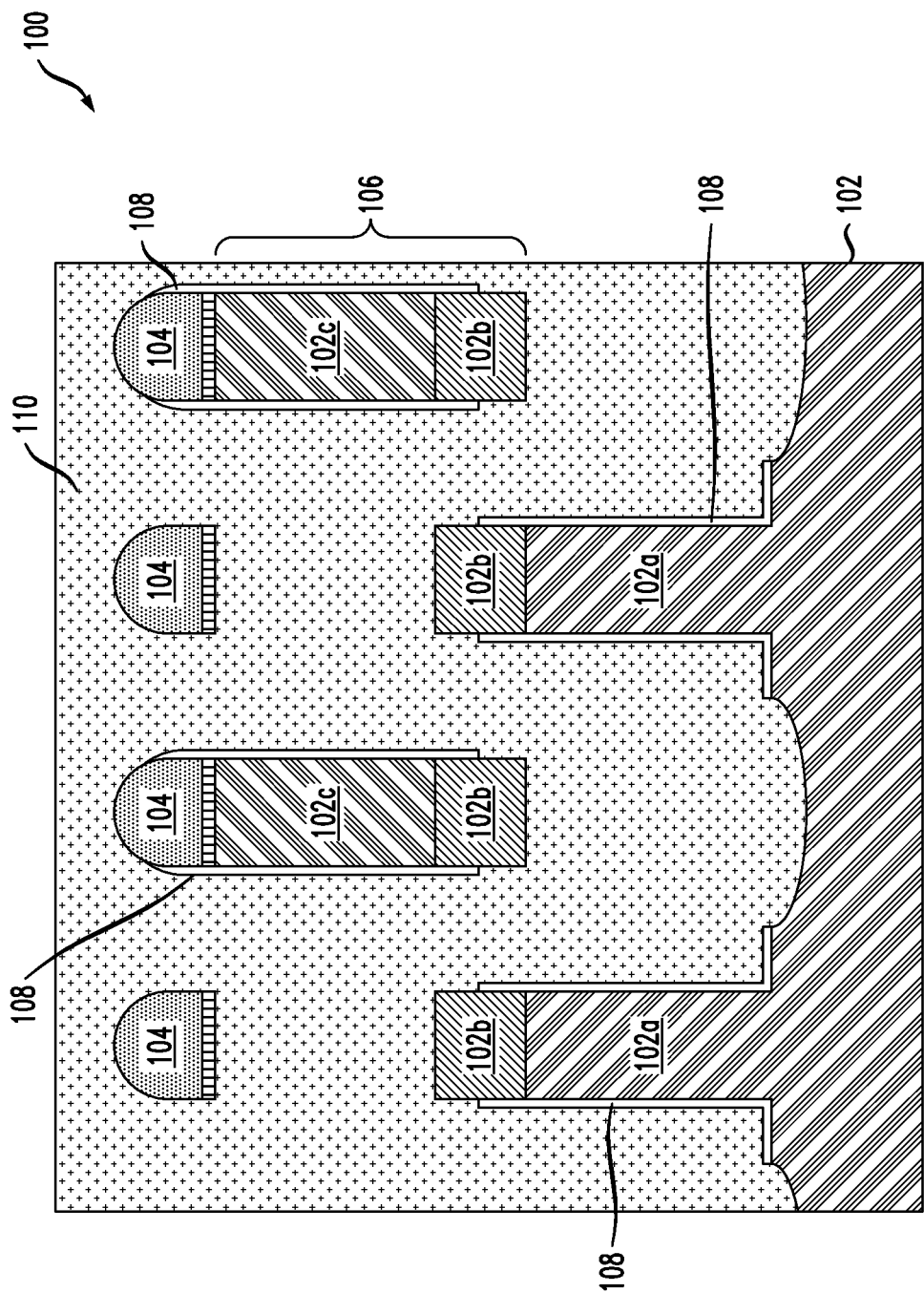
FIG. 12 is a schematic cross-sectional side view of the semiconductor structure at a twelfth-intermediate stage of fabrication, according to one or more illustrative embodiments.

A next step in forming vertically stacked fins for semiconductor structure 100 is illustrated in FIG. 12 in which the exposed portions of structure 100 are then filled with an oxide material. The oxide material can be the same or different as oxide fill 110. In one illustrative embodiment, the oxide fill is the same as oxide fill 110. In one embodiment, oxide fill 110 is formed by depositing a blanket layer of oxide in the exposed portions of structure 100 and over vertical nanowires 106 and then planarizing the oxide by, for example, a CMP process. The resulting structure 100 contains vertical crystalline nanowires 106 that are staggered in pitch between two layers containing the vertical nanowires 106 that are in a stacked configuration. The resulting structure 100 has staggered crystalline semiconducting channels 102a and 102c, that have the same pitch, but are shifted or translated between the top and bottom levels of the vertical fin array.

In one embodiment, the fin at the bottom of the stack may form a PFET transistor and the fin at the top of the stack may form an NFET transistor. However, the invention is not so limited and may include structures in which the transistor at the bottom of the stack and the transistor at the top of the stack may be a PFET and PFET, an NFET and NFET, or a NFET and PFET respectively.

The vertically stacked staggered semiconducting fins disclosed herein can be subjected to one or more additional processing steps. For example, a first field effect transistor can further comprise a source/drain region, and a gate structure comprising a gate dielectric layer and a metal gate layer. A second field effect transistor stacked on the first field effect transistor can further comprise a source/drain region, and a gate structure comprising a gate dielectric layer and a metal gate layer. In addition, one or more conductive vias can be in communication with either the gate structure of the first FET device or the gate structure of the second FET device.

The source/drain region can be formed by, for example, growing epitaxial semiconductor material on an exposed top surface of the nanowires 106 of the first field effect transistor. The epitaxial growth process is performed to deposit a crystalline layer onto a crystalline substrate beneath. The underlying substrate acts as a seed crystal. Epitaxial layers may be grown from gaseous or liquid precursors. Epitaxial silicon material may be grown using vapor-phase epitaxy (VPE), molecular-beam epitaxy (MBE), liquid-phase epitaxy (LPE), or other suitable process. The type of epitaxial material and dopant used to form the source region 112 will vary depending on whether the FET devices are P-type or N-type devices. Examples of semiconductor materials that may be suitable for the epitaxial growth of the source/drain region include, but are not limited to, silicon (single crystal, polysilicon, or amorphous), germanium (single crystal, polycrystalline, or amorphous), or a combination thereof.

After the semiconductor material is grown, it will be doped with dopant atoms using, for example, in-situ doping or ion implantation or in-situ doping during epitaxy. In this illustrative embodiment, the semiconductor material is doped with a p-type dopant such as, for example, boron, aluminum, gallium, indium, or alloys thereof, to form a PFET source region. In other embodiments as discussed below, the semiconductor material may be doped with a n-type dopant such as, for example, phosphorus, antimony, arsenic, or alloys thereof. After the doping process, the semiconductor material may have dopant a concentration ranging from approximately $1\times10^{19}$ atoms/cm$^3$ to approximately $5\times10^{21}$ atoms/cm$^3$.

It is to be understood that the methods discussed herein for fabricating semiconductor structures can be incorporated within semiconductor processing flows for fabricating other types of semiconductor devices and integrated circuits with various analog and digital circuitry or mixed-signal circuitry. In particular, integrated circuit dies can be fabricated with various devices such as transistors, diodes, capacitors, inductors, etc. An integrated circuit in accordance with embodiments can be employed in applications, hardware, and/or electronic systems. Suitable hardware and systems for implementing embodiments of the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein.

Furthermore, various layers, regions, and/or structures described above may be implemented in integrated circuits (chips). The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product.

The end product can be any product that includes integrated circuit chips, ranging from toys and other low-end applications to advanced computer products having a display, a keyboard or other input device, and a central processor.

Although illustrative embodiments have been described herein with reference to the accompanying drawings, it is to be understood that the invention is not limited to those precise embodiments, and that various other changes and modifications may be made by one skilled in art without departing from the scope or spirit of the invention.

What is claimed is:

1. A semiconductor structure, comprising:
   a substrate comprising a semiconductor material;
   a first semiconducting channel comprising a plurality of vertical nanowires, each vertical nanowire comprising a first semiconductor layer derived from the semiconductor material, a first insulating layer disposed on the first semiconductor layer, and a first oxide layer disposed on the first insulating layer; and
   a second semiconducting channel comprising a plurality of vertical nanowires, each vertical nanowire comprising a second oxide layer disposed on the substrate, a second insulating layer disposed on the second oxide layer, and a second semiconductor layer derived from the semiconductor material and disposed on the second insulating layer;
   wherein the first semiconducting channel and the second semiconducting channel are configured to be in a stacked configuration; and
   wherein each of the plurality of vertical nanowires of the first semiconducting channel are configured to be in alternating positions relative to each of the plurality of vertical nanowires of the second semiconducting channel.

2. The semiconductor structure of claim 1, wherein the substrate is a bulk substrate.

3. The semiconductor structure of claim 2, wherein the bulk substrate comprises silicon.

4. The semiconductor structure of claim 1, wherein the semiconductor material comprises silicon.

5. The semiconductor structure of claim 1, wherein the plurality of vertical nanowires of the first semiconducting channel and the plurality of vertical nanowires of the second semiconducting channel are disposed in a third oxide layer.

6. The semiconductor structure of claim 1, wherein the first semiconducting channel comprises a first vertical field-effect transistor and the second semiconducting channel comprises a second vertical field-effect transistor, wherein the second vertical field-effect transistor is configured to be stacked on the first vertical field-effect transistor.

7. The semiconductor structure of claim 6, wherein the first vertical field-effect transistor further comprises a first source/drain region, and a first gate structure comprising a gate dielectric layer and a metal gate layer, and the second field effect transistor further comprises a second source/drain region, and a second gate structure comprising a gate dielectric layer and a metal gate layer.

8. The semiconductor structure of claim 7, wherein the first vertical field-effect transistor is one of a n-type transistor or a p-type transistor and the second field effect transistor is one of a n-type transistor or a p-type transistor.

9. The semiconductor structure of claim 1, wherein the first semiconducting channel is an n-channel and the second semiconducting channel is a p-channel.

10. The semiconductor structure of claim 1, wherein the first semiconducting channel is a p-channel and the second semiconducting channel is an n-channel.

11. The semiconductor structure of claim 1, further comprising a first liner disposed on a portion of the substrate, on the first semiconductor layer and a portion of the first insulating layer of the plurality of vertical nanowires of the first semiconducting channel and a second liner disposed on the second semiconductor layer and a portion of the second insulating layer of the plurality of vertical nanowires of the second semiconducting channel.

12. A logic device, comprising:
   one or more semiconductor structures, wherein at least one of the one or more semiconductor structures comprises:
   a substrate comprising a semiconductor material;
   a first semiconducting channel comprising a plurality of vertical nanowires, each vertical nanowire comprising a first semiconductor layer derived from the semiconductor material, a first insulating layer disposed on the first semiconductor layer, and a first oxide layer disposed on the first insulating layer; and
   a second semiconducting channel comprising a plurality of vertical nanowires, each vertical nanowire comprising a second oxide layer disposed on the substrate, a second insulating layer disposed on the second oxide layer, and a second semiconductor layer derived from the semiconductor material and disposed on the second insulating layer;
   wherein the first semiconducting channel and the second semiconducting channel are configured to be in a stacked configuration; and
   wherein each of the plurality of vertical nanowires of the first semiconducting channel are configured to be in alternating positions relative to each of the plurality of vertical nanowires of the second semiconducting channel.

13. The logic device of claim 12, wherein the substrate is a bulk substrate.

14. The logic device of claim 13, wherein the bulk substrate comprises silicon.

15. The logic device of claim 14, wherein the semiconductor material comprises silicon.

16. The logic device of claim 12, wherein the plurality of vertical nanowires of the first semiconducting channel and the plurality of vertical nanowires of the second semiconducting channel are disposed in a third oxide layer.

17. The logic device of claim 16, wherein the first semiconducting channel comprises a first vertical field-effect transistor and the second semiconducting channel comprises a second vertical field-effect transistor, wherein the second vertical field-effect transistor is configured to be stacked on the first vertical field-effect transistor.

18. The logic device of claim 17, wherein the first vertical field-effect transistor further comprises a first source/drain region, and a first gate structure comprising a gate dielectric layer and a metal gate layer, and the second field effect transistor further comprises a second source/drain region, and a second gate structure comprising a gate dielectric layer and a metal gate layer.

19. The logic device of claim 18, wherein the first vertical field-effect transistor is one of a n-type transistor or a p-type transistor and the second field effect transistor is one of a n-type transistor or a p-type transistor.

20. The logic device of claim 12, wherein the semiconductor structure further comprises a first liner disposed on a portion of the substrate, on the first semiconductor layer and a portion of the first insulating layer of the plurality of vertical nanowires of the first semiconducting channel and a second liner disposed on the second semiconductor layer and a portion of the second insulating layer of the plurality of vertical nanowires of the second semiconducting channel.

21. An integrated circuit, comprising:
one or more semiconductor structures, wherein at least one of the one or more semiconductor structures comprises:
a substrate comprising a semiconductor material;
a first semiconducting channel comprising a plurality of vertical nanowires, each vertical nanowire comprising a first semiconductor layer derived from the semiconductor material, a first insulating layer disposed on the first semiconductor layer, and a first oxide layer disposed on the first insulating layer; and
a second semiconducting channel comprising a plurality of vertical nanowires, each vertical nanowire comprising a second oxide layer disposed on the substrate, a second insulating layer disposed on the second oxide layer, and a second semiconductor layer derived from the semiconductor material and disposed on the second insulating layer;
wherein the first semiconducting channel and the second semiconducting channel are configured to be in a stacked configuration; and
wherein each of the plurality of vertical nanowires of the first semiconducting channel are configured to be in alternating positions relative to each of the plurality of vertical nanowires of the second semiconducting channel.

22. The integrated circuit of claim 21, wherein the substrate is a bulk substrate.

23. The integrated circuit of claim 22, wherein the bulk substrate comprises silicon.

24. The integrated circuit of claim 23, wherein the semiconductor material comprises silicon.

25. The integrated circuit of claim 21, wherein the plurality of vertical nanowires of the first semiconducting channel and the plurality of vertical nanowires of the second semiconducting channel are disposed in a third oxide layer.

* * * * *